(12) United States Patent
Jang

(10) Patent No.: US 12,068,293 B2
(45) Date of Patent: Aug. 20, 2024

(54) MICRO LED DISPLAY

(71) Applicant: 3M INNOVATIVE PROPERTIES COMPANY, St. Paul, MN (US)

(72) Inventor: Soo-Jin Jang, Yongin-si (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 280 days.

(21) Appl. No.: 17/597,803

(22) PCT Filed: Aug. 24, 2020

(86) PCT No.: PCT/IB2020/057897
§ 371 (c)(1),
(2) Date: Jan. 24, 2022

(87) PCT Pub. No.: WO2021/038425
PCT Pub. Date: Mar. 4, 2021

(65) Prior Publication Data
US 2022/0359471 A1    Nov. 10, 2022

Related U.S. Application Data

(60) Provisional application No. 62/893,227, filed on Aug. 29, 2019.

(51) Int. Cl.
*H01L 25/075* (2006.01)
*G09F 9/00* (2006.01)
*G09F 9/33* (2006.01)

(52) U.S. Cl.
CPC ............ *H01L 25/0753* (2013.01); *G09F 9/00* (2013.01); *G09F 9/33* (2013.01)

(58) Field of Classification Search
CPC ........... H01L 25/0753; G09F 9/00; G09F 9/33
See application file for complete search history.

(56) References Cited

U.S. PATENT DOCUMENTS

| 4,995,043 A | 2/1991 | Kuwata |
| 2011/0102704 A1 | 5/2011 | Dunn |

(Continued)

FOREIGN PATENT DOCUMENTS

| CN | 1678155 A | 10/2005 |
| CN | 109212884 A | 1/2019 |

(Continued)

OTHER PUBLICATIONS

International Search Report for PCT International Application No. PCT/IB2020/057897, mailed on Nov. 10, 2020, 3 pages.

*Primary Examiner* — Tracie Y Green
(74) *Attorney, Agent, or Firm* — Clifton F. Richardson; Robert S. Moshrefzadeh

(57) ABSTRACT

A display includes a plurality of blue, green and red light emitting micro-LEDs having respective blue, green and red emission spectra having respective emission peaks at respective wavelengths with respective full width at half maxima (FWHMs). A partial light transmitting layer is disposed on the plurality of blue, green and red light emitting micro-LEDs and includes substantially distinct blue, green and red transmission bands with respective blue, green and red FWHMs. For substantially normally incident light, the partial light transmitting layer has an optical transmittance of greater than about 50% at each of the blue, green and red peak wavelengths. The blue, green and red FWHMs of the partial light transmitting layer are less than the respective blue, green and red FWHMs of the blue, green and red light emitting micro-LEDs by at least 10%.

21 Claims, 3 Drawing Sheets

(56) References Cited

U.S. PATENT DOCUMENTS

| | | | |
|---|---|---|---|
| 2011/0241044 | A1 | 10/2011 | Jang |
| 2013/0308193 | A1 | 11/2013 | Ogawa |
| 2013/0314651 | A1 | 11/2013 | Hwang |
| 2015/0021569 | A1 | 1/2015 | Lee |
| 2015/0301407 | A1* | 10/2015 | Chan ................. G02F 1/133621 349/64 |
| 2017/0097452 | A1 | 4/2017 | Fukuda |
| 2017/0288097 | A1* | 10/2017 | Li ........................... H01L 33/50 |
| 2017/0363472 | A1 | 12/2017 | Abdulhalim |
| 2021/0149096 | A1 | 5/2021 | Meng |

FOREIGN PATENT DOCUMENTS

| | | |
|---|---|---|
| JP | 08250767 | 9/1996 |
| JP | 2009158140 | 7/2009 |
| JP | 2012215827 A | 11/2012 |
| JP | 2015110691 | 6/2015 |
| KR | 101255881 | 4/2013 |
| WO | 2001084227 W | 11/2001 |
| WO | 2006019016 W | 2/2006 |

\* cited by examiner

MICRO LED DISPLAY

TECHNICAL FIELD

The disclosure generally relates to micro-LED displays, specifically micro-LED displays having an optical filter that selectively transmits light from micro-LED light sources.

BACKGROUND

Micro Light emitting diodes (micro-LEDs) appear in many different applications, such as displays, illuminating controls, automotive signals, and the like. Many applications use multiple micro-LEDs in a single device. Color and light intensity tolerance ranges for micro-LEDs can be large and may result in a non-uniform appearance, both within a single device and across multiple devices. Micro-LEDs, if not calibrated, come with large amount of variation in brightness and color. To achieve better uniformity in brightness and color, LED manufacturers often employ a binning process where LEDs of similar brightness and color are "binned" together. The binning process typically increases the manufacturing cost of LEDs, especially in mass production. Displays having non binning micro-LEDs often utilize color calibration solutions to refine the color gamut.

SUMMARY

In some aspects of the disclosure, a display including a plurality of blue, green and red light emitting micro-LEDs is provided. The plurality of blue, green and red light emitting micro-LEDs have respective blue, green and red emission spectra. The blue, green and red emission spectra include respective blue, green and red emission peaks at respective blue, green and red peak wavelengths with respective blue, green and red full width at half maxima (FWHMs). The display includes a partial light transmitting layer disposed on the plurality of blue, green and red light emitting micro-LEDs. The partial light transmitting layer includes substantially distinct blue, green and red transmission bands with respective blue, green and red FWHMs. For substantially normally incident light, the partial light transmitting layer has an optical transmittance of greater than about 50% at each of the blue, green and red peak wavelengths. The blue, green and red FWHMs of the partial light transmitting layer are less than the respective blue, green and red FWHMs of the blue, green and red light emitting micro-LEDs by at least 10%.

In other aspects of the disclosure, a display including a plurality of blue light emitting light sources is provided. Each blue light emitting light source has an emission spectrum including a blue emission peak at a blue peak wavelength having an emission intensity Ib. The emission spectrum of at least one of the blue light emitting light sources includes a first emission intensity I1 at a first visible wavelength that is not a blue wavelength, wherein I1/Ib>0.2. A partial light transmitting layer is disposed on the plurality of blue light emitting light sources. For substantially normally incident light, the partial light transmitting layer has an optical transmittance Tb at the blue peak wavelength and an optical transmittance T1 at the first visible wavelength, wherein T1/Tb<0.1.

BRIEF DESCRIPTION OF DRAWINGS

The various aspects of the disclosure will be discussed in greater detail with reference to the accompanying figures where, FIG. 1 schematically illustrates a micro-LED display having a optical filter according to certain aspects of disclosure.

The figures are not necessarily to scale. Like numbers used in the figures refer to like components. However, it will be understood that the use of a number to refer to a component in a given figure is not intended to limit the component in another figure labelled with the same number.

DETAILED DESCRIPTION OF ILLUSTRATIVE EMBODIMENTS

In the following description, reference is made to the accompanying drawings that form a part hereof and in which various embodiments are shown by way of illustration. It is to be understood that other embodiments are contemplated and may be made without departing from the scope or spirit of the present description. The following detailed description, therefore, is not to be taken in a limiting sense.

Micro-LED displays are used in a variety of applications ranging from relatively large devices including signage, computer monitors and televisions, to small, handheld devices, and touch sensitive devices such as cell telephones, gaming devices, and other applications. Larger size micro-LED display units that do not use backlight techniques are self-emitting displays. Self-emitting micro-LED displays typically need color calibration to produce a refined color gamut, more so when non-binned LEDs are used.

Figure 1:
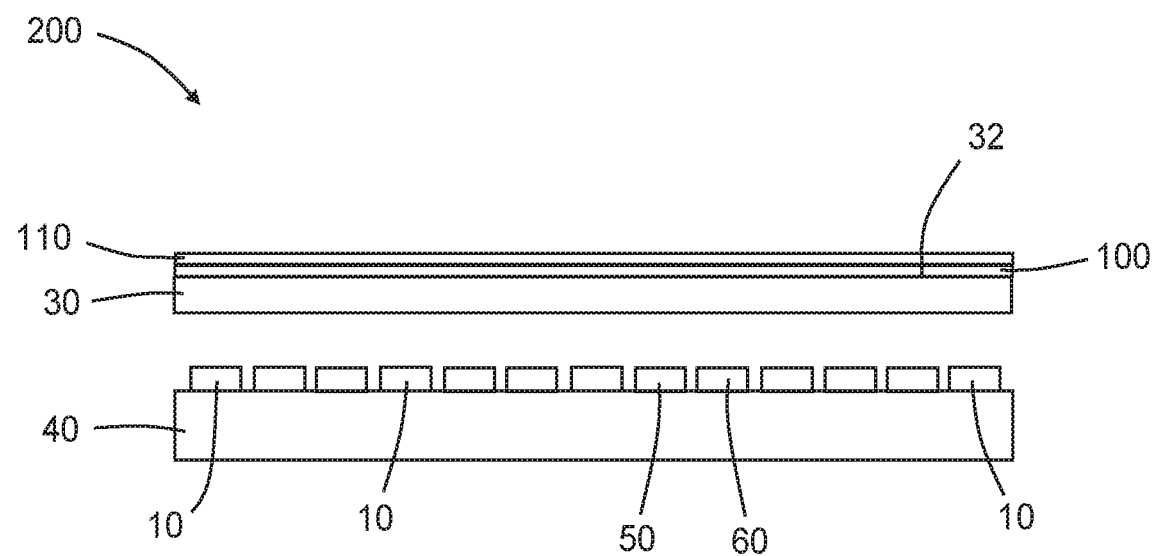

FIG. 1 illustrates a micro-LED display (200). The display (200), in some aspects, includes a plurality of blue (10), green (50) and red (60) light emitting micro-LEDs. In some aspects, the plurality of blue, green and red light emitting micro-LEDs (10, 50, 60) form a regular array and are disposed on a substrate (40). The micro-LEDs that form the regular array of discrete light sources are in electrical communication such that the micro-LEDs can operate in a series or parallel manner or a combination of series and parallel as desired. Arrangements of micro-LEDs in a regular array may provide better brightness control over each micro-LED to dynamically vary the illumination in coordination with the display image. Mounting red, green, and blue micro-LEDs directly on a substrate enables miniaturization of display devices and may be advantageous in terms of display resolution and color gamut.

In some embodiments, the substrate (40) may be a printed circuit board (PCB) and the plurality of blue, green and red light emitting micro-LEDs (10, 50, 60) are disposed on the PCB (40). The array of micro-LEDs may be mounted on the PCB by any technique such as, for example, mechanical fastening, soldering, or using adhesives. The PCB may include a plurality of electrically conductive traces connected to the micro-LEDs for energizing and controlling a light emission of the micro-LEDs. In some other aspects, the substrate (40) may include a thin-film transistor (TFT) glass layer.

Figure 4:
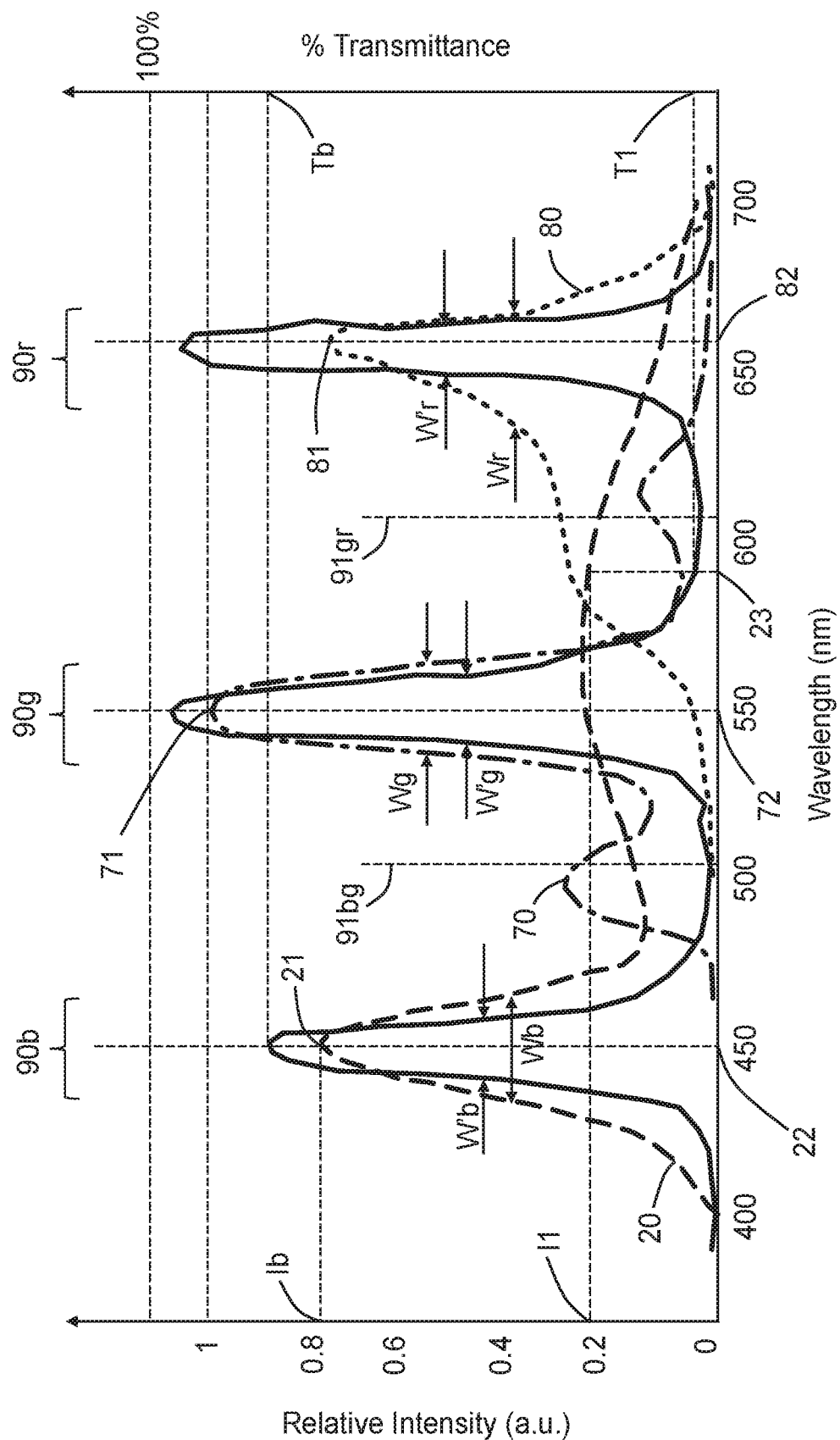
FIG. 4 is a graphical representation of the blue, green and red spectra of respective blue, green and red micro-LEDs superposed with the blue, green and red transmission bands of the optical filter partially transmitting normally incident light.

As graphically shown in FIG. 4, the blue, green, and red micro-LEDs have respective blue (20), green (70) and red

(80) emission spectra. Each of the blue, green and red emission spectra includes respective blue (21), green (71) and red (81) emission peaks at respective blue (22), green (72) and red (82) peak wavelengths. Each of the blue (20), green (70) and red (80) emission spectra have respective blue (Wb), green (Wg) and red (Wr) full width at half maxima (FWHMs). For instance, the blue light emitting micro-LEDs may have a visible wavelength in a range from 430 to 470 nm and an FWHM of less than 30 nm, the green light emitting micro-LEDs may have a visible wavelength in a range from 520 to 565 nm and an FWHM of less than 40 nm, and the red light emitting micro-LEDs may have a visible wavelength in a range from 625 to 700 nm and an FWHM of less than 25 nm.

Figure 2:
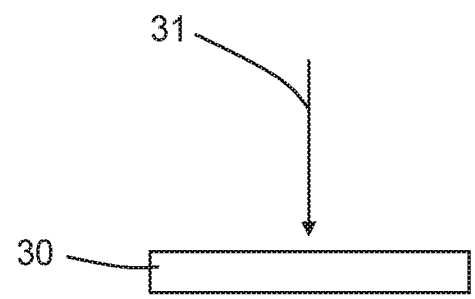
FIG. 2 schematically illustrates normally incident light on the optical filter disposed on the micro-LED display.

In some embodiments, a partial light transmitting layer (30) is disposed on the plurality of blue (10), green (50) and red (60) light emitting micro-LEDs. The partial light transmitting layer (30) includes substantially distinct blue (90$b$), green (90$g$) and red (90$r$) transmission bands with respective blue (W'b), green (W'g) and red (W'r) FWHMs. In some aspects, for substantially normally incident light (31) on the partial light transmitting layer (30) (as shown in FIG. 2), the partial light transmitting layer (30) may have an optical transmittance of greater than about 50% at each of the blue, green and red peak wavelengths. In some instances, the optical transmittance may be greater than 60%, or 65%, or 70% or 80%. The partial light transmitting layer (30) may be constructed to pass and block selective wavelength to produce sharp and narrow output spectrum. In some aspects, the partial light transmitting layer (30) may be constructed such that the blue (W'b), green (W'g) and red (W'r) FWHMs of the partial light transmitting layer (30) are less than the respective blue (Wb), green (Wg) and red (Wr) FWHMs of the blue (10), green (50) and red (60) light emitting micro-LEDs by at least 10%, or at least 20% or at least 30-40%, and, in some instances, by at least 50% or at least 60%.

Figure 3:
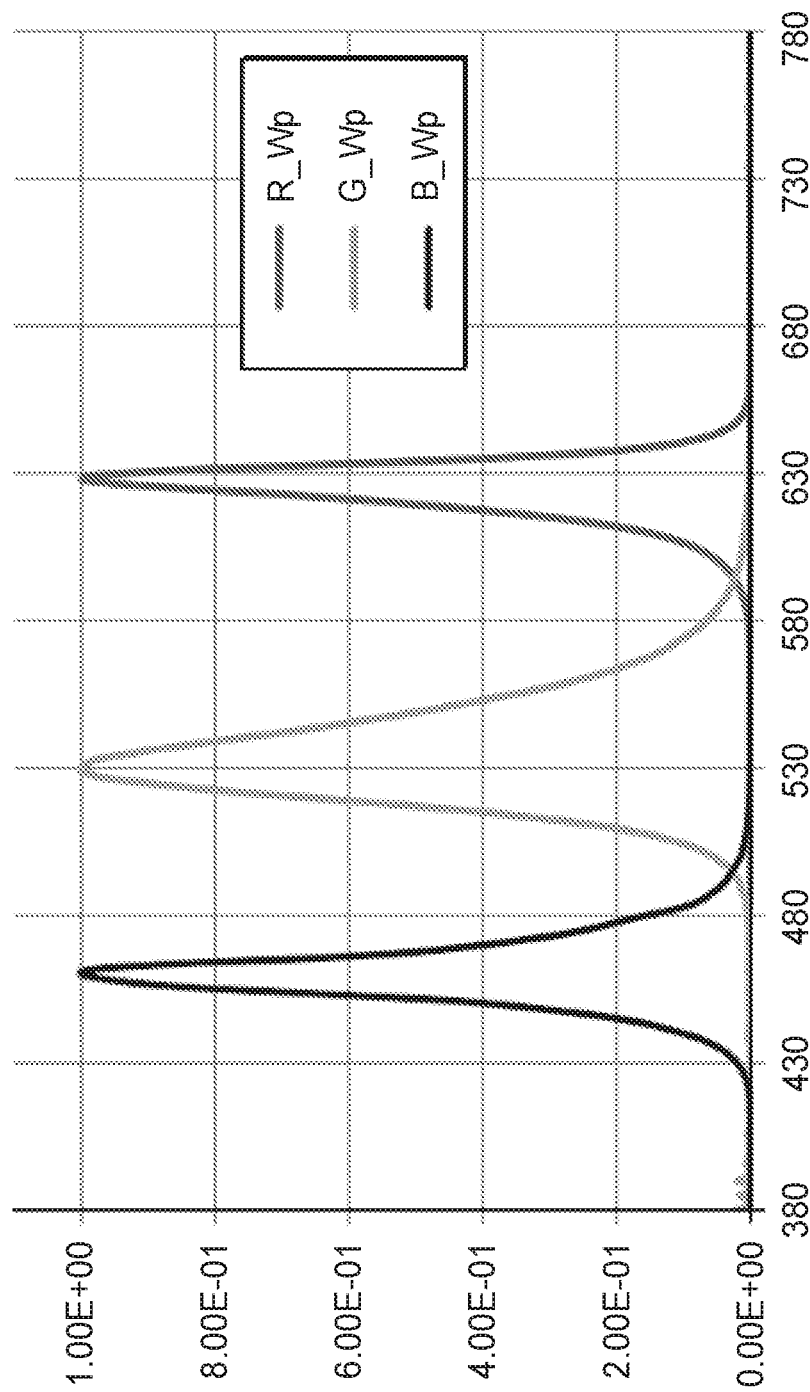
FIG. 3 is a graphical view showing light emission spectra of RGB light sources with optical filter according to some aspects of the disclosure.

An exemplary graphical representation of an emission spectra according to embodiments of the disclosure is shown in FIG. 3. For a display (200) having a partial light transmitting layer (30) disposed on the plurality of blue (10), green (50) and red (60) light emitting micro-LEDs, the blue (W'b), green (W'g), and red (W'r) FWHMs of the partial light transmitting layer (30) may be less than 20 nm, less than 30 nm, and less than 15, respectively. In some other embodiments the blue (W'b), green (W'g), and red (W'r) FWHMs of the partial light transmitting layer (30) may be about 7.5 nm, 12 nm, and 6 nm, respectively.

A blue-green wavelength (91$bg$) borders the blue light component emitted by the blue light emitting micro-LEDs (10) and the green light component emitted by the green light emitting micro-LEDs (50) and is between the blue and green peak wavelengths. A green-red wavelength (91$gr$) borders the green light component emitted by the green light emitting micro-LEDs (50) and the red light component emitted by the red light emitting micro-LEDs (60) and is between the green and red peak wavelengths. In some aspects, for each of at least one blue-green wavelength (91$bg$) disposed between the blue and green peak wavelengths and at least one green-red wavelength (91$gr$) disposed between the green and red peak wavelengths, the partial light transmitting layer has an optical transmittance of less than about 10%, or less than about 8%, or less than about 5%. The blue-green wavelength (91$bg$) in some instances may be approximately 500 nm and the green-red wavelength (91$gr$) in some instances may be approximately 600 nm.

In some embodiments, the optical absorption of the partial light transmitting layer (30) may be greater than about 1%, or 3%, or 5% or 10% at at least one of the blue, green, and red peak wavelengths. The partial light transmitting layer (30) may include an optically absorbing material. The optical absorption of the partial light transmitting layer (30), by virtue of the optically absorbing material, may be greater than about 1% or 3%, or 5% or 10% at at least one of the blue, green, and red peak wavelengths. In some embodiments, the optically absorbing material may include carbon black, and the like.

In some embodiments, the partial light transmitting layer (30) includes an anti-reflection layer (100) to mitigate Fresnel reflection. The anti-reflection layer (100) may be disposed on a major surface (32) of the partial light transmitting layer (30), away from the plurality of blue, green and red light emitting micro-LEDs (10, 50, 60), in some aspects.

Suitable anti-reflection methods to form the anti-reflection layer (100) are interference coatings known in the art to reduce/eliminate reflectivity, including suitably designed layers of high and low refractive index materials, single layers of low index materials, boehmite made by hydrolyzing a thin coating of aluminum, solgel coatings, moth's-eye microstructured coatings, and graded index coatings. Also suitable are sintered coatings of absorbing materials.

In some embodiments, the partial light transmitting layer (30) includes a hardcoat (110). The hardcoat (110) may be disposed on a major surface (32) of the partial light transmitting layer (30), away from the plurality of blue, green and red light emitting micro-LEDs. The hardcoat (110), in some aspects, may be a tinted hardcoat with optimal carbon black concentration such that an optical transmittance of at least about 50% at each of the blue, green and red peak wavelengths is possible. In some instances, the hardcoat (110) may be formed from a coating composition including one or more crosslinkable polymeric materials as polymeric matrix material or binder for hosting nanoparticles. Exemplary binders may include, for example, one or more (meth)acrylic oligomers and/or monomers as binder materials. The hardcoat (110) may, in some aspects, further include known additives such as an anti-fog agent, an antistatic agent, and an easy clean agent (e.g., an anti-fingerprinting agent, an anti-oil agent, an anti-lint agent, an anti-smudge agent, or other agents adding an easy-cleaning function).

In some embodiments, the partial light transmitting layer (30) disposed on the plurality of blue (10), green (50) and red (60) light emitting micro-LEDs, includes a layer of hardcoat (110) and a layer of anti-reflection coating (100).

In other embodiments, a display (200) includes a plurality of blue light emitting light sources (10). Each blue light emitting light source may be a blue light emitting micro-LED. In some aspects, the plurality of blue light emitting light sources (10) are disposed on a substrate (40). Mounting the blue light emitting light source directly on a substrate enables miniaturization of display devices and may be advantageous in terms of display resolution and color gamut. In some embodiments, the substrate (40) may be a printed circuit board (PCB) and the plurality of blue light emitting light sources (10) are disposed on the PCB (40). The blue light emitting light sources (10) may be mounted on the PCB by any technique such as, for example, mechanical fastening, soldering, or using adhesives. The PCB may include a plurality of electrically conductive traces connected to the light sources for energizing and controlling a light emission of the light sources. In some other aspects, the substrate (40) may include a thin-film transistor (TFT) glass layer.

Each blue light emitting light source (10) has an emission spectrum (20) including a blue emission peak (21) at a blue peak wavelength (22) as shown in FIG. 4, having an emission intensity (Ib). In some instances, the blue peak wavelength (22) may be less than about 475 nm, say about 450 nm. In some aspects, the emission spectrum of at least one of the blue light emitting light sources includes a first emission intensity (I1) at a first visible wavelength (23) that is not a blue wavelength. In some instances, the first visible wavelength (23) may be a green wavelength, and in other instances the first visible wavelength (23) may be a red wavelength. For instance, the first visible wavelength (23) may be between 550-625 nm. In some embodiments, the ratio between the first emission intensity (I1) at a first visible wavelength (23) that is not a blue wavelength, and the emission intensity (Ib) may be such that I1/Ib>0.2, or I1/Ib>0.3, or I1/Ib>0.4, or I1/Ib>0.5.

In some aspects, a partial light transmitting layer (30) is disposed on the plurality of blue light emitting light sources (10). For substantially normally incident light (31) on the partial light transmitting layer (30) (as shown in FIG. 2), the partial light transmitting layer (30) has an optical transmittance (Tb) at the blue peak wavelength and an optical transmittance (T1) at the first visible wavelength (23). In some instances, the blue peak wavelength may be less than about 475 nm, may be about 450 nm. In some instances, the first visible wavelength (23) may be a green wavelength, and in other instances the first visible wavelength (23) may be a red wavelength. For instance, the first visible wavelength (23) may be between 550-625 nm. In some embodiments, the ratio between the optical transmittance (T1) at the first visible wavelength (23) and the optical transmittance (Tb) at the blue peak wavelength may be such that T1/Tb<0.1. In other instance the ratio between the optical transmittance (T1) at the first visible wavelength (23) and the optical transmittance (Tb) at the blue peak wavelength may be such that T1/Tb<0.05.

In some aspects, the partial light transmitting layer (30) may include a plurality of polymeric layers numbering greater than about 50, or greater than 100 in total. The polymeric layers may be sufficiently thin so that light reflected at a plurality of interfaces undergoes constructive or destructive interference to give the partial light transmitting layer the desired reflective or transmissive properties. In some embodiments, the polymeric layers include one or more of a polycarbonate, a polymethyl methacrylate (PMMA), a polyethylene terephthalate (PET), a glycol-modified polyethylene terephthalate (PETG), a polyethylene naphthalate (PEN), and a PEN/PET copolymer. A lesser number of layer pairs over a wavelength range may increase transmission at lower wavelength at corresponding incidence angles for a narrow bandwidth source.

In some embodiments, the partial light transmitting layer (30) includes an anti-reflection layer (100) to mitigate Fresnel reflection. The anti-reflection layer (100) may be disposed on a major surface (32) of the partial light transmitting layer (30), away from the plurality of blue light emitting sources (10), in some aspects. Suitable anti-reflection methods to form the anti-reflection layer (100) are interference coatings known in the art to reduce/eliminate reflectivity, including suitably designed layers of high and low refractive index materials, single layers of low index materials, boehmite made by hydrolyzing a thin coating of aluminum, solgel coatings, moth's-eye microstructured coatings, and graded index coatings. Also suitable are sintered coatings of absorbing materials.

In some embodiments, the partial light transmitting layer (30) includes a hardcoat (110). The hardcoat (110) may be disposed on a major surface (32) of the partial light transmitting layer (30), away from the plurality of blue light emitting sources (10). The hardcoat (110), in some aspects, may be a tinted hardcoat with optimal carbon black concentration such that an optical transmittance of at least about 50% is possible. The hardcoat (110) may, in some aspects, further include known additives such as an anti-fog agent, an antistatic agent, and an easy clean agent (e.g., an anti-fingerprinting agent, an anti-oil agent, an anti-lint agent, an anti-smudge agent, or other agents adding an easy-cleaning function).

In some embodiments, the partial light transmitting layer (30) disposed on the plurality of blue light emitting light sources (10), includes a layer of hardcoat (110) and a layer of anti-reflection coating (100).

The invention claimed is:

1. A display comprising a plurality of blue, green and red light emitting micro-LEDs having respective blue, green and red emission spectra comprising respective blue, green and red emission peaks at respective blue, green and red peak wavelengths with respective blue, green and red full width at half maxima (FWHMs); and
   a partial light transmitting layer disposed on the plurality of blue, green and red light emitting micro-LEDs and comprising substantially distinct blue, green and red transmission bands with respective blue, green and red FWHMs, such that for substantially normally incident light, the partial light transmitting layer has an optical transmittance of greater than about 50% at each of the blue, green and red peak wavelengths, and wherein the blue, green and red FWHMs of the partial light transmitting layer are less than the respective blue, green and red FWHMs of the blue, green and red light emitting micro-LEDs by at least 10%.

2. The display of claim 1, wherein for each of at least one blue-green wavelength disposed between the blue and green peak wavelengths and at least one green-red wavelength disposed between the green and red peak wavelengths, the partial light transmitting layer has an optical transmittance of less than about 10%.

3. A display comprising a plurality of blue light emitting light sources, each blue light emitting light source having an emission spectrum comprising a blue emission peak at a blue peak wavelength having an emission intensity Ib, wherein the emission spectrum of at least one of the blue light emitting light sources comprises a first emission intensity I1 at a first visible wavelength that is not a blue wavelength, wherein I1/Ib>0.2; and
   a partial light transmitting layer disposed on the plurality of blue light emitting light sources, such that for substantially normally incident light, the partial light transmitting layer has an optical transmittance Tb at the blue peak wavelength and an optical transmittance T1 at the first visible wavelength, T1/Tb<0.1.

4. The display of claim 3, wherein each blue light emitting light source is a blue light emitting micro-light-emitting-diode (micro-LED).

5. The display of claim 3, wherein I1/Ib >0.4.

6. The display of claim 3, wherein the plurality of blue light emitting light sources are disposed on a substrate, wherein the substrate is a printed circuit board, or wherein the substrate comprises a thin-film transistor (TFT) glass layer.

7. The display of claim 3, wherein the partial light transmitting layer comprises a plurality of polymeric layers numbering greater than about 50 in total.

8. The display of claim 3, wherein the first visible wavelength is a green wavelength, or a red wavelength, and wherein the blue peak wavelength is less than about 475 nm.

9. The display of claim 3, wherein the partial light transmitting layer has an optical absorption of greater than about 1% at the blue peak wavelength, wherein the greater than about 1% optical absorption is by virtue of the of the partial light transmitting layer comprising an optically absorbing material, and wherein the optically absorbing material comprises carbon black.

10. The display of claim 3, wherein the partial light transmitting layer comprises an anti-reflection layer disposed on a major surface thereof away from the plurality of blue light emitting light sources.

11. The display of claim 1, wherein the plurality of blue, green and red light emitting micro-LEDs form a regular array and are disposed on a substrate.

12. The display of claim 1, wherein the substrate is a printed circuit board.

13. The display of claim 1, wherein the substrate comprises a thin-film transistor (TFT) glass layer.

14. The display of claim 1, wherein the partial light transmitting layer has an optical absorption of greater than about 1% at at least one of the blue, green, and red peak wavelengths.

15. The display of claim 14, wherein the greater than about 1% optical absorption is by virtue of the partial light transmitting layer comprising an optically absorbing material.

16. The display of claim 15, wherein the optically absorbing material comprises carbon black.

17. The display of claim 1, wherein the partial light transmitting layer comprises an anti-reflection layer disposed on a major surface thereof away from the plurality of blue, green and red light emitting micro-LEDs.

18. The display of claim 1, wherein the partial light transmitting layer comprises a hardcoat disposed on a major surface thereof away from the plurality of blue, green and red light emitting micro-LEDs.

19. The display of claim 3, wherein $I1/Ib>0.3$.

20. The display of claim 3, wherein $T1/Tb<0.05$.

21. The display of claim 3, wherein the partial light transmitting layer comprises a hardcoat disposed on a major surface thereof away from the plurality of blue light emitting light sources.

* * * * *